United States Patent [19]
Asakura

[11] Patent Number: 5,969,645
[45] Date of Patent: Oct. 19, 1999

[54] KEY INPUT METHOD AND CIRCUIT

[75] Inventor: Keiichi Asakura, Kanagawa, Japan

[73] Assignee: Sony Corporation, Tokyo, Japan

[21] Appl. No.: 08/912,000

[22] Filed: Aug. 15, 1997

[30] Foreign Application Priority Data

Sep. 6, 1996 [JP] Japan .................................. 8-257446

[51] Int. Cl.$^6$ ................................................. H03K 17/94
[52] U.S. Cl. ............................. 341/26; 341/22; 345/168; 400/477
[58] Field of Search ...................... 341/22, 26; 345/168; 400/479, 477, 476; 340/825.79

[56] References Cited

U.S. PATENT DOCUMENTS 4,412,218  10/1983  Niitsu ........................................ 341/22
4,609,908   9/1986  Amano ....................................... 341/22
5,081,453   1/1992  Endoh et al. ............................... 341/22
5,254,989  10/1993  Verrier et al. ............................. 341/26

*Primary Examiner*—Michael Horabik
*Assistant Examiner*—Timothy Edwards, Jr.
*Attorney, Agent, or Firm*—Jay H. Maioli

[57] ABSTRACT

A microcomputer has an output port and an input port. A plurality of switches are provided between and matrix-connected to respective bits of the output port and respective bits of the input port. The microcomputer renders all of the bits of the output port in an output state, and in this state, checks whether an output of the output port is obtained at one of the bits of the input port. When an output of the output port is obtained at one of the bits of the input port, data indicating a manipulated one of the plurality of switches is acquired by rendering, in order, the bits of the output port in an output state, and then the process of acquiring data indicating a manipulated switch is again executed after a lapse of a predetermined amount of time. The acquired data is made effective if a first acquired data and a second acquired data are identical.

8 Claims, 5 Drawing Sheets

5,969,645

KEY INPUT METHOD AND CIRCUIT

BACKGROUND OF THE INVENTION

The present invention relates to a key input circuit.

For example, an audio signal processing system of a one-box type audio apparatus can be constructed as shown in FIG. 1.

FIG. 1 corresponds to one channel of a stereo system. Audio signals from a CD player, a tuner, a tape deck, etc. are supplied, via input terminals 1A–1N, to a function switch 2, where a desired audio signal is selected.

The selected audio signal is supplied to a surround circuit 3, where it is subjected to a process of correcting or altering a reproduction sound field, such as a surround process. An output signal of the surround circuit 3 is subjected to a frequency characteristic adjustment in a tone circuit 4, and a resulting signal is supplied to a speaker 7 via an attenuator circuit 5 for volume adjustment and a power amplifier 6.

A control means, i.e., a microcomputer 8 for system control is connected to the circuits 3–5. Various manipulation keys 9 are connected to. the microcomputer 8. The characteristics of the circuit 3–5 are controlled or altered in accordance with manipulations of the keys 9, whereby a desired reproduction sound field is obtained.

Each key 9 is constituted of a non-lock type push switch. The number of switches depends on the number of adjustment items of the circuits 3–5 and other factors, and tens of switches may be provided in some cases. It is not appropriate to simply connect such a large number of switches to the microcomputer 8.

Therefore, the switches that constitute the keys 9 are connected, in matrix form, to an output port and an input port of the microcomputer 8, and dynamic scanning is performed to judge which of the keys 9 has been pushed.

Alternatively, the switches that constitute the keys 9 are connected to voltage sources, for instance, a voltage divider circuit. When a certain key 9 is pushed, a DC voltage is output whose magnitude is different for each key 9. After being A/D-converted, the output DC voltage is input to the microcomputer 8, which then judges which of the keys 9 has been pushed.

However, in the former case of using dynamic scanning, scan pulses may be mixed, as noise, into an audio signal line. They are easily mixed into an audio signal line particularly in the vicinity of high-impedance circuits such as the attenuator circuit 5. If scan-pulses are mixed into an audio signal line, as a matter of course the sound quality is deteriorated.

Further, since scan pulses are formed consecutively during a key input waiting period, scan pulses mixed into an audio signal line causes the speaker 7 to produce a continuous sound like an oscillation sound. Thus, reproduction sound causes an uncomfortable feeling.

A commonly employed countermeasure against the above-mentioned type of noise is a method of preventing scan pulses from mixing into an audio signal line by using a shield plate. However, this method increases the cost of the system. In addition, there may occur a case in which a sufficient shielding effect is not obtained, depending on the layout of parts and circuits on a printed wiring board and the arrangement of wiring patterns.

On the other hand, in the latter case of using A/D conversion, although there occurs no noise mixing, the use of an A/D converter results in a cost increase. Further, since the microcomputer 8 is required to incorporate an A/D converter, the degree of freedom in selecting a microcomputer is low.

SUMMARY OF THE INVENTION

The present invention has been made to solve the above-described problems, and an object of the invention is therefore to enable detection of a manipulated switch from among a plurality of switches without causing noise.

To attain the above object, the invention provides a key input method for recognizing a manipulated switch among a plurality of switches provided between and matrix-connected to respective bits of an output port and respective bits of an input port, comprising the steps of rendering all of the bits of the output port in an output state, and, in this state, checking whether an output of the output port is obtained at one of the bits of the input port; if an output of the output port is obtained, acquiring data indicating a manipulated one of the plurality of switches by rendering, in order, the bits of the output port in an output state; executing again a process of acquiring data indicating a manipulated switch after a lapse of a predetermined time; and making the acquired data effective if a first acquired data and a second acquired data are identical.

With the above method, only one scan is performed for a switch, whereby the rate of occurrence of noise can be reduced greatly.

DESCRIPTION OF THE PREFERRED EMBODIMENT

The configuration of an embodiment of the present invention will be described below with reference to FIG. 2. A control means, i.e., a microcomputer 10 for system control, is, in this case, a 16-bit microcomputer MB90673 of Fujitsu Ltd. The microcomputer 10 has a CPU 11, a ROM 12 that stores various processing routines, and a RAM 13 for data storage and provision of a work area. The memories 12 and 13 are connected to the CPU 11 via a system bus 19.

Figure 4:
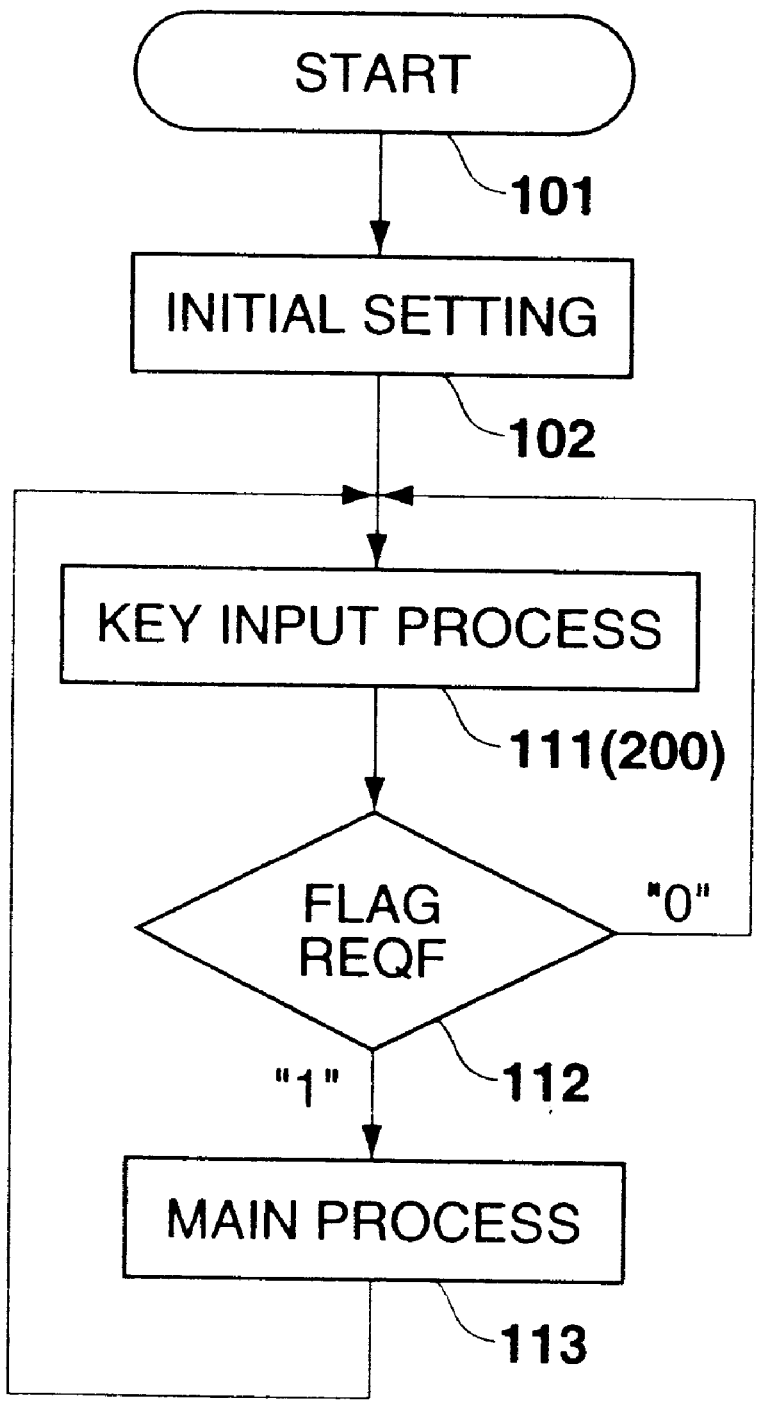
FIGS. 4–6 are flowcharts showing a process executed by a CPU according to the embodiment of the invention.
Figure 5:
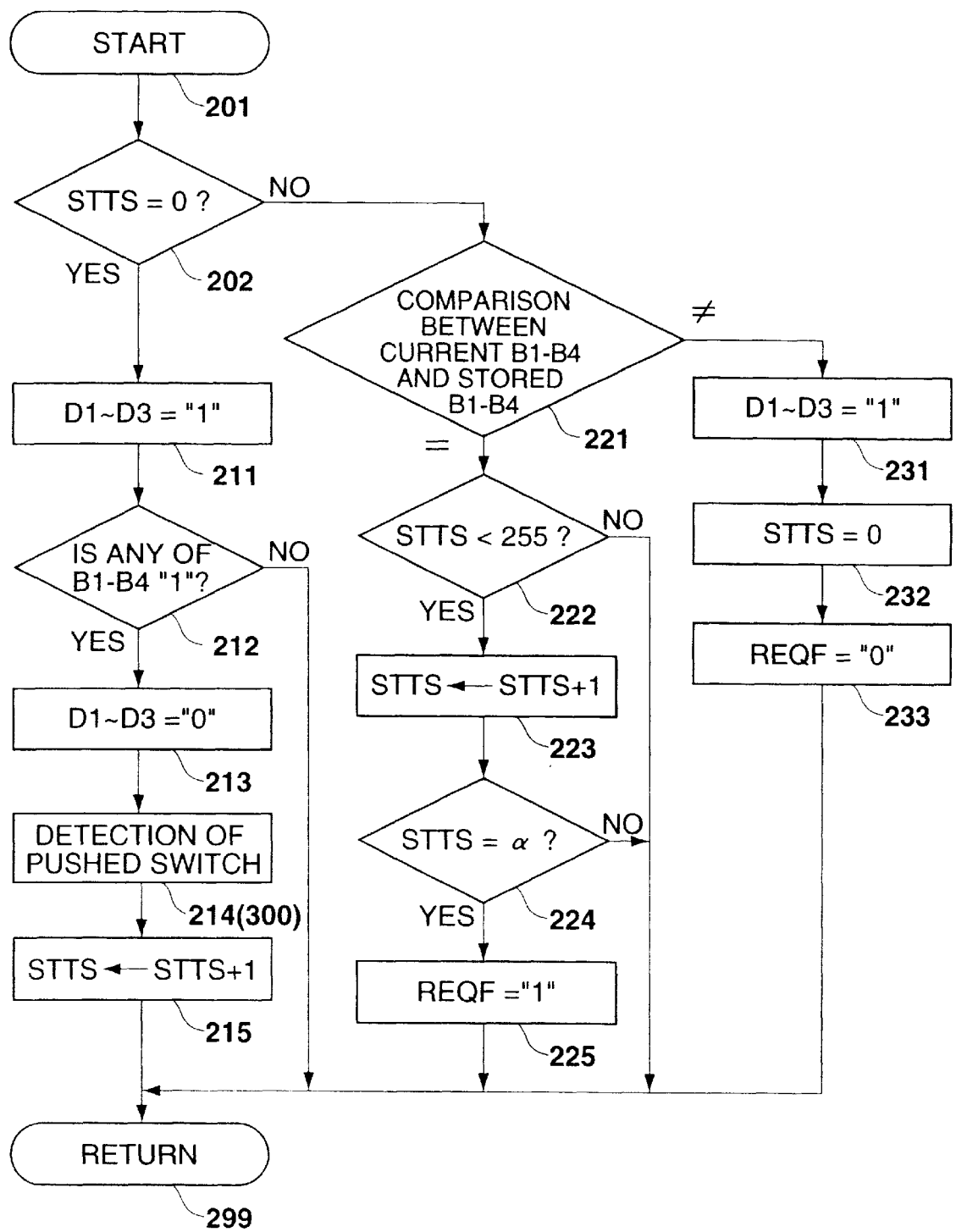
Figure 6:
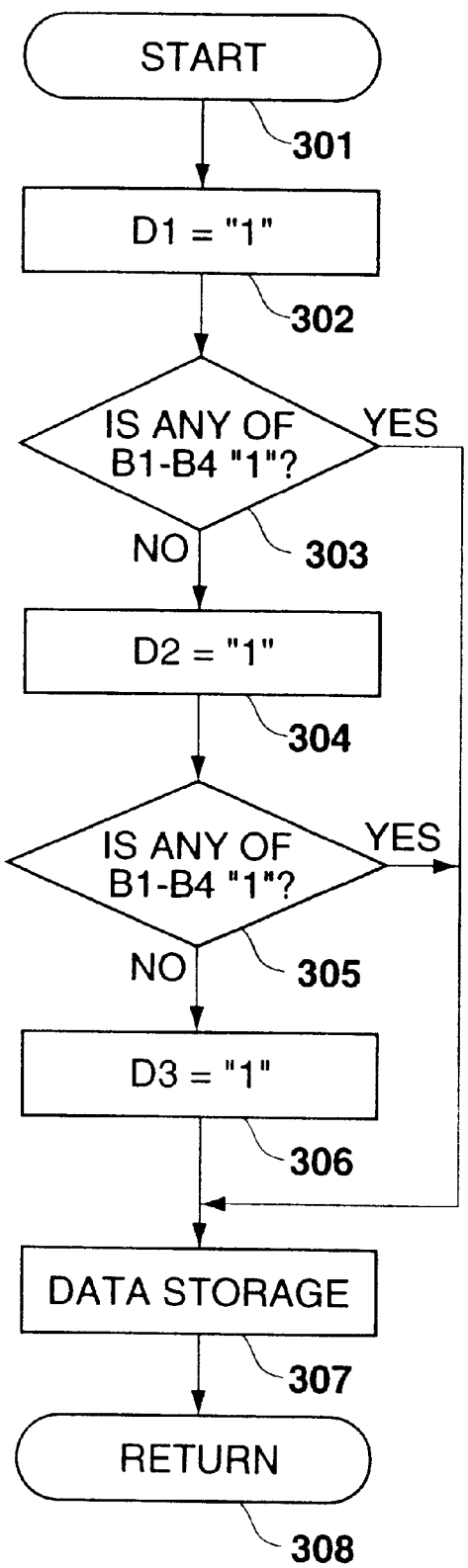

For example, the processing routines stored in the ROM 12 include, for instance, a main routine 100 shown in FIG. 4 and subroutines 200 and 300 shown in FIGS. 5 and 6, respectively, details of which will be described later. As for the main routine 100, to simplify the description, FIG. 4 shows only a partial process for causing execution of a process corresponding to a key input result. The routine 200 is a key input process and the routine 300 is its subroutine.

Figure 1:
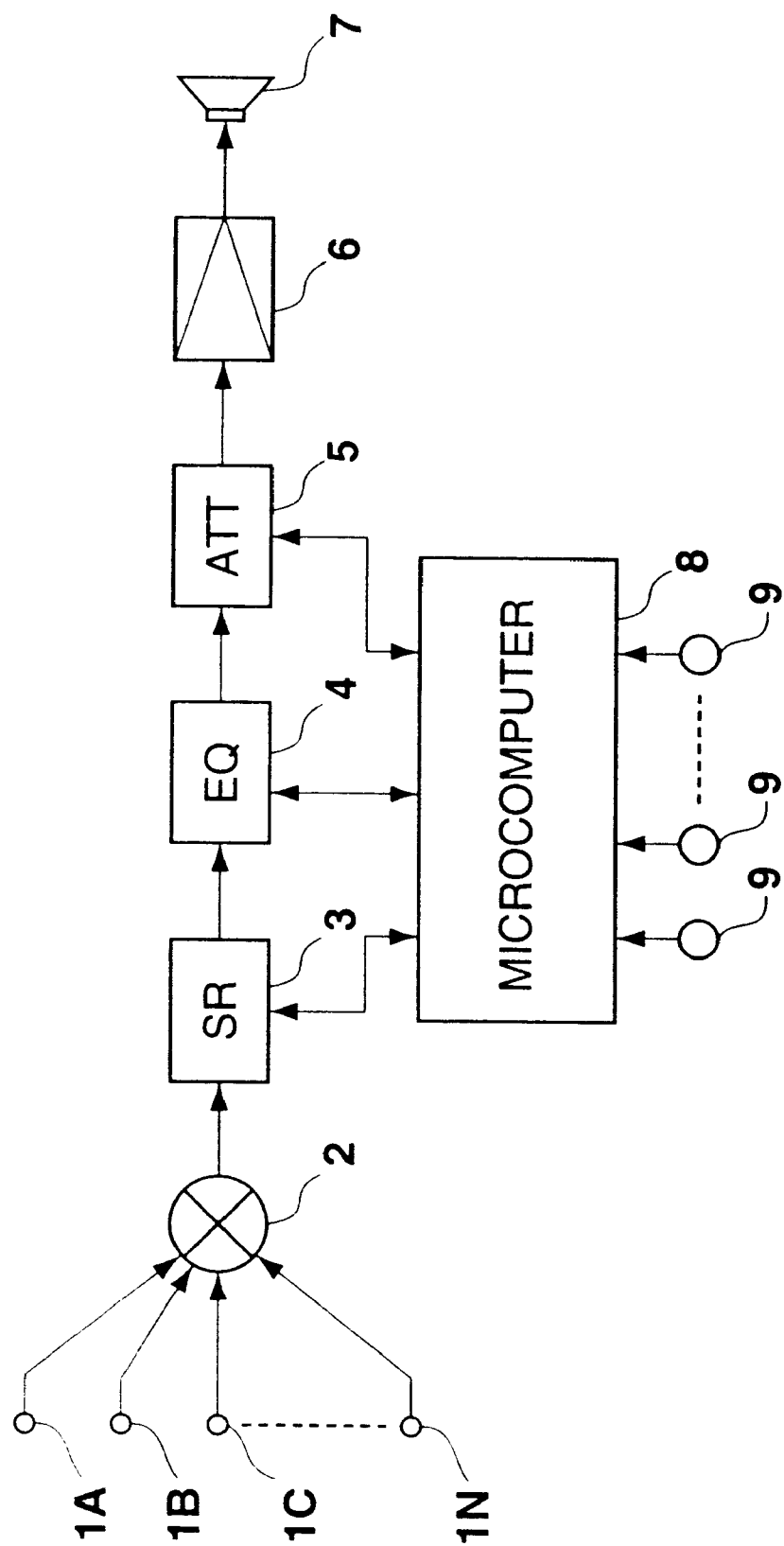
FIG. 1 shows an audio signal processing system of a one-box type audio apparatus.

Further, an output port 14 and an input port 15 are connected to the bus 19, and the microcomputer 10 is connected to a control object via the ports 14 and 15. With an assumption that the microcomputer 10 is connected to the circuits of the control object in the same manner as the microcomputer 8 shown in FIG. 1, the ports 14 and 15 are connected to each of the circuits 3–5 shown in FIG. 1. Thus, the microcomputer 10 can supply control signals to the circuits 3–5 and can read necessary data. A display circuit 16 is connected to the bus 19, to allow various kinds of display.

Figure 2:
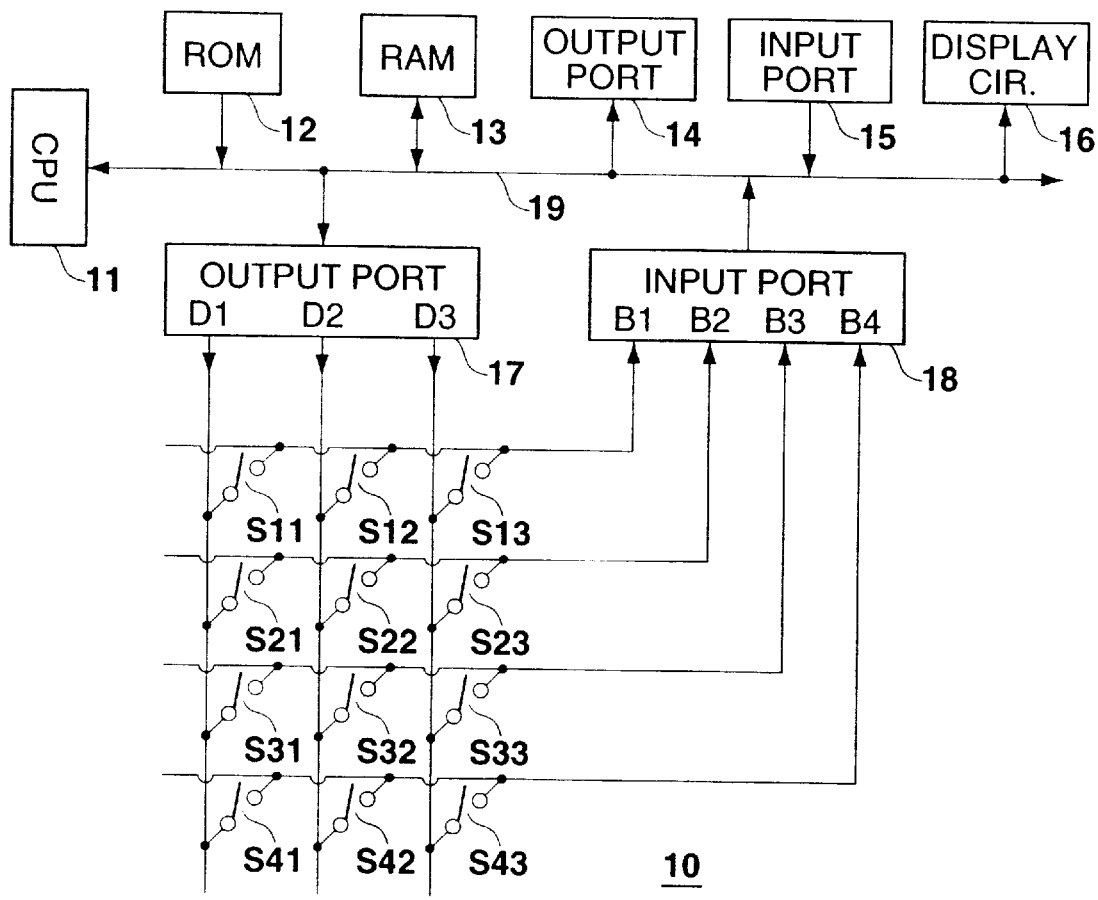
FIG. 2 is a block diagram showing a configuration relating to a microcomputer according to an embodiment of the invention.

To simplify the description, the example of FIG. 2 is directed to a case where there are 12 manipulation switches.

For execution of a key input process for those manipulation switches, an output port 17 and an input port 18 are connected to the bus 19 and 12 non-lock type push switches S11–S13 to S41–S43 are provided between and connected to the ports 17 and 18.

In the example of FIG. 2, in accordance with the number of switches S11–S43, the port 17 has three output bits D1–D3 and the port 18 has four input bits B1–B4. The switches S11–S43 are provided between the bits D1–D3 and the bits B1–B4 so as to assume a 4-row/3-column matrix. The switches S11–S43 are normally-open switches.

With the above configuration, when the power is turned on, the CPU 11 starts to execute the routine 100 from step 101. At step 102, the respective parts are initialized or subjected to an initial setting. At step 111, the routine 200 is executed. As described later in detail, in the routine 200 it is checked whether a key input has occurred. A request flag REQF is set to "0" if no key input has occurred, and to "1" if a key input has occurred. At this time, data indicating an input key is prepared in the RAM 13.

When the execution of the routine 200 has been completed, the process of the CPU 11 returns to step 112, where the request flag REQF is checked. If REQF=1, the process goes from step 112 to step 113.

At step 113, a process corresponding to the input key, for instance, a control on the attenuator circuit 5 (see FIG. 1), is executed in accordance with the data that was prepared in the RAM 13 at step 111 (routine 200). The process then returns to step 111. Thus, if a key input has occurred, the routine 100 executes a process corresponding to the input key.

If REQF=0 at step 112, the process returns from step 112 to step 111. Thus, if there is no key input, steps 111 and 112 are repeatedly executed as a key input waiting procedure.

In the routine 200, the occurrence of a key input is detected and the input key is recognized in the following manner (see FIG. 5). That is, in the routine 200, the processingly the CPU 11 starts from step 201. At step 202, it is checked whether the value of a status counter STTS is equal to "0."

Figure 3:
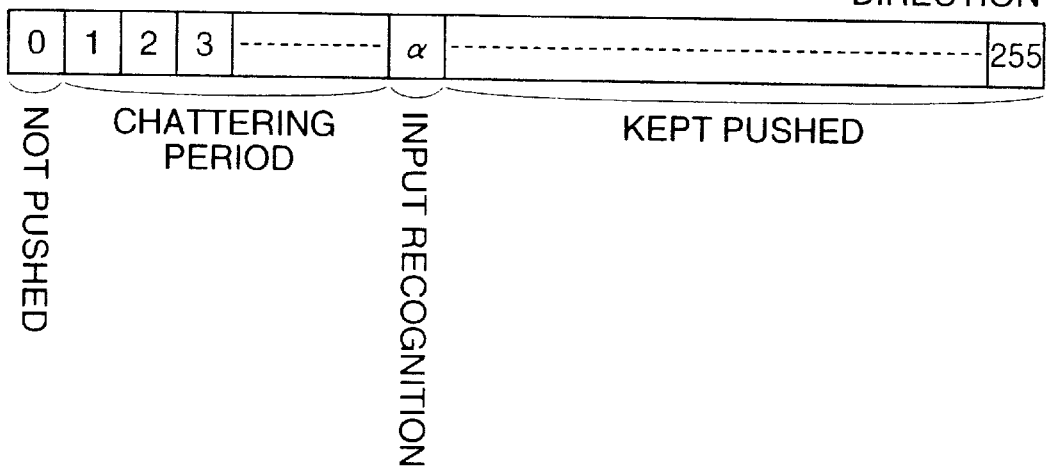
FIG. 3 illustrates an operation relating to a status counter according to the embodiment of the invention.

The status counter STTS is used commonly for the switches S11–S43. When one of the switches S11–S43 is pushed, STTS is incremented by one for each occurrence to indicate the status of the switches S11–S43. More specifically, the counter STTS has a size of 8 bits, for instance, and, as shown in FIG. 3, the following judgment is made with the counter STTS:

(1) STTS=0

It is considered that none of the switches S11–S43 have been pushed.

(2) 0<STTS<α

It is considered that one of the switches S11–S43 has been pushed but it is in a chattering period now.

(3) STTS=α

It is recognized that one of the switches S11–S43 has been pushed, and a corresponding process is to be executed.

(4) 0<STTS<255

It is considered that one of the switches S11–S43 is kept pushed.

If STTS=α, the switch output is made effective. If STTS≠α, the switch output is disregarded.

The value α is set, depending on the processing speed of the CPU 11, at 10–20, for instance. Outputs of the switches S11–S43 may include chattering. To avoid the influence of chattering, the chattering period is provided by utilizing the value a (see item (2) above).

If STTS=0 at step 202, the process goes from step 202 to step 211, where all of the bits D1–D3 of the port 17 are set to "1." At step 212, it is checked whether any of the bits B1–B4 of the port 18 is "1." In this case, all of D1–D3 are "1." Therefore, all of B1–B4 are "0" if none of the switches S11–S43 are pushed, and, if at least one of the switches S11–S43 is pushed, the corresponding one of the bits B1–B4 becomes "1."

If all of the bits B1–B4 are "0," which means none of the switches S11–S43 are pushed, the process goes from step 212 to step 299 to terminate the execution of the routine 200.

Thus, at steps 211 and 212, if none of the switches S11–S43 are pushed, neither the value of the status counter STTS nor the request flag REQF is changed when the execution of the routine 200 is finished.

On the other hand, if at least one of the bits B1–B4 is judged to be "1" at step 212, which means that at least one of the switches S11–S43 is pushed, the process goes from step 212 to step 213, where the bits D1–D3 are set to "0." At step 214, the routine 300 is executed whereby the pushed switch is detected.

That is, in the routine 300, the process of the CPU 11 starts from step 301. At step 302, the bits D1–D3 of the port 17 are set such that D1=1, D2=0, and D3=0. At step 303, it is checked whether any of the bits B1–B4 is "1." If any of the bits B1–B4 is "1," the process goes from step 303 to step 307, where current data B1–B4 and D1–D3 (i.e., the values of the bits B1–B4 and D1–D3 of the ports 18 and 17) are stored in the RAM 13. At step 308, the execution of the routine 300 is finished.

If it is judged at step 303 that none of the bits B1–B4 are "1," the process goes to step 304, where the bits D1–D3 of the port 17 are set such that D1=0, D2=1, and D3=0. At step 305, it is checked whether any of the bits B1–B4 is "1." If any of the bits B1–B4 is "1," the process goes from step 305 to step 307, where current data B1–B4 and D1–D3 are stored in the RAM 13. Then, the execution of the routine 300 is finished.

If it is judged at step 305 that none of the bits B1–B4 are "1," the process goes to step 306, where the bits D1–D3 of the port 17 are set such that D1=0, D2=0, and D3=1. At step 307, current data B1–B4 and D1–D3 are stored in the RAM 13. Then, the execution of the routine 300 is finished.

Since the process has proceeded to step 214 (routine 300) because at least one of the switches S11–S43 was pushed, the bits B1–B4 should include a bit having a value "1" when one of steps 302, 304 and 306 is executed.

For example, if the switch S42 is pushed, B4 becomes "1" when D2 is "1." Therefore, the process goes from step 301 to step 305, then to step 307, where data B1 to B3=0, B4=1, D1=0, D2=1, and D3=0 are stored in the RAM 13.

Conversely, assume that data B1 to B3=0, B4=1, D1=0, D2=1, and D3=0 are given. Since B4=1, the pushed switch should be one of S41, S42, and S43. Further, since D2=1, the pushed switch should be S42 among the above switches S41, S42, and S43. In this manner, the pushed switch can be known from the values of the bits B1–B4 and D1–D3 that are stored in the RAM 13.

The process then goes from step 214 (routine 300) to step 215, where the status counter STTS is incremented by "1." At step 299, the execution of the routine 200 is finished. Incidentally, step 215 does not include an operation of changing the values of the bits D1–D3 of the port 17, the values of the bits D1–D3 remain the same as when step 214 was executed, i.e., the values stored in the RAM 13.

Thus, as a result of the execution of steps 211–215, when one of the switches S11–S43 is pushed, data B1–B4 and D1–D3 which indicate the pushed switch are written to the RAM 13 and the status counter STTS is incremented by "1."

If STTS is judged to be not "0" at step 202, the process goes from step 202 to step 221, where the current values of the bits B1–B4 of the port 18 are compared with the data B1–B4 stored in the RAM 13.

In this case, since the values of the bits D1–D3 have not been changed after the previous execution of step 214, they are equal to the data D1–D3 that were stored in the RAM 13 when step 214 was executed previously. Therefore, if the switch that was pushed at the time of the previous execution of step 214 is equal to the switch that is pushed when step 221 is executed, the comparison result at step 221 should be "identical." If no switch is pushed any more when step 221 is executed, or when steps 211–215 are executed due to occurrence of noise, the comparison result of step 221 should be "not identical" in general.

If the comparison result is "identical" (i.e., the same switch is pushed), the process goes from step 221 to step 222, where it is checked whether the value of the status counter STTS is smaller than 255. If STTS=255, the counter STTS will overflow when it is incremented and a switch input should be disregarded as shown in FIG. 3 (STTS>$\alpha$) even if the switch is kept pushed. Therefore, the process goes from step 222 to step 299 to terminate the execution of the routine 200.

Even when an output is obtained from the switches S11–S43, if STTS=255, it is considered that the switch is kept pushed and the output of the switches S11–S43 is disregarded.

If it is judged that STTS<255 at step 222, the process goes from step 222 to step 223, where the counter STTS is incremented by "1." At step 224, it is checked whether STTS=$\alpha$. If STTS≠$\alpha$, the process goes from step 224 to step 299 to terminate the execution of the routine 200.

Thus, if STTS≠$\alpha$, an output of the switches S11–S43 is disregarded with a judgment that it is a chattering period now (0<STTS<$\alpha$) or that one of the switches S11–S43 is kept pushed ($\alpha$<STTS<255).

On the other hand, if STTS=$\alpha$ at step 224, the process goes from step 224 to step 225, where the request flag REQF is set to "1." At step 299, the execution of the routine 200 is finished.

Thus, if STTS=$\alpha$, the request flag REQF is set to "1" with a judgment that one of the switches S11–S43 is pushed and the chattering process has already finished. At this time, the data B1–B4 and D1–D3 indicating the pushed switch are stored in the RAM 13 because of the previous execution of step 214.

Further, if the comparison result at step 221 is such that the values of the bits B1–B4 of the port 18 are not equal to the data B1–B4 stored in the RAM 13 (e.g., a different switch is pushed), the process goes from step 221 to step 231, where all of the bits D1–D3 of the port 17 are set to "1."

Then, the status counter STTS is cleared to "0" at step 232, and the request flag REQF is set to "0" at step 233. At step 299, the execution of the routine 200 is finished.

Thus, during repeated execution of the routine 200, when one of the switches S11–S43 is pushed, the request flag REQF to indicate depression of a switch is set to "1" and data B1–B4 and D1–D3 indicating the pushed switch are stored in the RAM 13. During the course of the above operation, the chattering process is executed.

Since the routine 200 is constructed as described above, the overall process proceeds in the following manner with the routine 200 executed at step 111 of the routine 100.

The routine 100 starts to be executed at step 101, and initialization is performed at step 102. As a result, both STTS and REQF are initialized to "0."

When the routine 200 is first executed at step 111, the process proceeds in order of step 201→ step 202→ step 211 → step 212→ step 299. A key input waiting procedure is effected such that the state of STTS=0 and REQF=0 is maintained and only step 111 is repeatedly executed.

If one of the switch S11–S43 is pushed during the key input waiting procedure, when step 111, i.e., the routine 200, is executed next time, steps 213–215 are executed whereby data B1–B4 and D1–D3 indicating the pushed switch are stored in the RAM 13 and STTS is set to "1."

However, REQF is still "0" in this state, only step 111 is executed again. During the execution of step 111, since STTS≠0, the process proceeds in order of step 201→ step 202→ step 221→ step 222→ step 223→ step 224→ step 299, whereby only the operation of incrementing the counter STTS is performed. That is, the chattering process is executed.

When it is judged at step 224 that STTS has reached $\alpha$, step 225 is executed whereby the request flag REQF is set to "1." Therefore, when the execution of step 111 has finished, the process goes from step 112 to step 113, where a desired process corresponding to the data B1–B4 and D1–D3 stored in the RAM 13 is executed.

If the depression of the one of the switches S11–S43 is stopped, it is judged at step 221 that the data B1–B4 have been changed when step 111, i.e., the routine 200, is executed next time. Therefore, steps 231–233 are executed whereby both STTS and REQF are initialized to "0." Thereafter, the state of waiting for a next key input is established.

A manipulated switch among the switches S11–S43 is recognized in the above manner. During that process, as for scans performed on the switches S11–S43 at step 214, only one scan is performed for each set of switches S11–S41, S12–S42, or S13–S43 at the maximum and hence each set of switches is not scanned consecutively. As a result, noise generation can be suppressed whereby deterioration in sound quality can be prevented in an audio apparatus, for instance. Further, since scans are not performed consecutively, there does not occur an event that continuous sound is generated from speakers due to consecutive scan pulses.

Further, the invention can beg implemented only by changing the algorithm of a check on the switches S11–S43. Therefore, there is no cost increase in contrast to the case of using a shield plate and it is not necessary to consider the layout of parts and circuits on a printed wiring board or the arrangement of wiring patterns.

Still further, the microcomputer 10 need not be of a type incorporating an A/D converter. Therefore, cost increase can be avoided also in this respect and the degree of freedom in selecting a specific type of the microcomputer 10 is increased.

Incidentally, simultaneous depressions of plural ones of the switches S11–S43 can be detected in the following manner. That is, in the routine 300, every time one of the bits D1–D3 of the port 17 is set to "1," values of the bits B1–B4 of the port 18 are stored in the RAM 13. At step 231, a similar process is executed such that a comparison relating to bits B1–B4 is performed every time one of the bits D1–D3 is set to "1."

As described above, according to the invention, since scans on a switch are not performed consecutively, noise generation can be suppressed and continuous sound can be prevented from being generated from speakers in an audio apparatus, for instance.

Further, there occurs no cost increase, and it is not necessary to consider the layout of parts and circuits on a printed wiring board or the arrangement of wiring patterns. In addition, the degree of freedom in selecting a microcomputer is increased.

What is claimed is:

1. A key input method for recognizing one or more manipulated switches among a plurality of switches provided between and matrix-connected to respective bits of an output port and respective bits of an input port, the method comprising the steps of:

setting an initial state by rendering all of the bits of the output port in a first state and then determining whether one or more of the bits of the input port is in the first state;

rendering all of the bits of the output port in a second state when it is determined that one or more of the bits of the input port is in the first state;

acquiring data indicating a manipulated one or ones of the plurality of switches by rendering, in order, the bits of the output port in the first state when it is determined that one or more of the bits of the input port is in the first state;

repeating the step of acquiring data after a lapse of a predetermined amount of time; and making the acquired data effective if a first acquired data and a second acquired data are identical.

2. The key input method according to claim 1, wherein if none of the bits of the input port is determined to be in the first state it is considered that none of the plurality of switches has been manipulated.

3. The key input method according to claim 1, further comprising the step of restoring the initial state when a manipulated switch has been released.

4. The key input method according to claim 1, further comprising the step of determining a status counter value in order to determine whether to proceed with one or more processes respectively corresponding to the manipulated one or ones of the plurality of switches.

5. A key input circuit comprising:

a plurality of switches provided between and matrix-connected to respective bits of an output port and respective bits of an input port; and control means for determining whether one or more of the plurality of switches has been manipulated, wherein the control means includes the output port and the input port, sets an initial state by rendering all of the bits of the output port in a first state and then determines whether one or more of the bits of the input port is in the first state, renders all of the bits of the output port in a second state when it is determined that one or more of the bits of the input port is in the first state;

acquires first data indicating a manipulated one or ones of the plurality of switches by rendering, in order, the bits of the output port in the first state when it is determined that one or more of the bits of the input port is in the first state, acquires second data indicating a manipulated one or ones of the plurality of switches after a lapse of a predetermined amount of time, and makes the first and second acquired data effective if the first and second acquired data are identical.

6. The key input circuit according to claim 5, wherein if none of the bits of the input port is in the first state the control means considers that none of the plurality of switches has been manipulated.

7. The key input circuit according to claim 5, wherein the control means restores the initial state when a manipulated switch has been released.

8. The key input circuit according to claim 4, wherein the control means determines a status counter value in order to determine whether to proceed with one or more processes respectively corresponding to the manipulated one or ones of the plurality of switches.

* * * * *